US005654630A

United States Patent [19]
Shimoyama et al.

[11] Patent Number: 5,654,630
[45] Date of Patent: Aug. 5, 1997

[54] CONTACTLESS SENSOR DRIVEN BY SINGLE POWER SUPPLY

[75] Inventors: Kenichi Shimoyama; Youichi Arai; Tsutomu Saigo, all of Susono, Japan

[73] Assignee: Yazaki Corporation, Tokyo, Japan

[21] Appl. No.: 644,577

[22] Filed: May 10, 1996

[30] Foreign Application Priority Data

May 11, 1995 [JP] Japan .................. 7-113193

[51] Int. Cl.$^6$ .................................. G01R 19/00
[52] U.S. Cl. .................. 324/117 H; 324/127; 323/353; 323/356
[58] Field of Search .................. 324/117 H, 127, 324/99 R, 117 R, 251, 252; 307/309; 338/32 H; 313/357, 358; 323/355, 356, 357, 358, 353

[56] References Cited

U.S. PATENT DOCUMENTS

| | | | |
|---|---|---|---|
| 4,961,049 | 10/1990 | Ghislanzoni | 324/117 H |
| 5,132,608 | 7/1992 | Nishifuji et al. | 324/99 R |
| 5,146,156 | 9/1992 | Marcel | 324/127 |

FOREIGN PATENT DOCUMENTS

| | | |
|---|---|---|
| 4-24070 | 2/1992 | Japan . |
| 7-140180 | 6/1995 | Japan . |

Primary Examiner—Kenneth A. Wieder
Assistant Examiner—Barry C. Bowser
Attorney, Agent, or Firm—Oblon, Spivak, McClelland, Maier & Neustadt, P.C.

[57] ABSTRACT

A sensor contactlessly driven by a single power supply is disclosed. A current flows in a resistor $R_L$ through the secondary winding of a coil in the direction corresponding to the direction of magnetic fluxes generated in the coil in accordance with discharge or charge mode of a main battery. The input terminal of a voltage follower is connected to the voltage-dividing point of a series circuit including resistors $R_1$ and $R_2$ and a reference voltage control circuit. The reference voltage control circuit changes the input voltage of the voltage follower in accordance with the direction of the current flowing in the resistor $R_L$. It follows therefore that the measurement range is switched in accordance with discharge or charge mode of the main battery, with the result that the overall measurement range can be widened in spite of the fact that only a single power supply +Vcc is used.

5 Claims, 3 Drawing Sheets

CONTACTLESS SENSOR DRIVEN BY SINGLE POWER SUPPLY

BACKGROUND OF THE INVENTION

1. Field of the Invention

The present invention relates to a sensor driven contactlessly by a single power supply, or more in particular to a sensor driven contactlessly by a single power supply adapted for enlarging the range in which the voltage or current is measured in contactless fashion by driving a single power supply.

2. Prior Art

Explanation will be made below with reference to a contactless voltage sensor or a contactless current sensor used with an electric automotive vehicle.

An electric automotive vehicle is driven by a battery of cells, and the driver of the electric automotive vehicle decides on the remaining distance coverable by observing the residual capacity of the battery on display. The estimation of the residual capacity, therefore, requires a very high precision.

For this reason, the contactless measurement of a voltage or a current generally uses a servo type suitable for high-precision measurement of all the measurement methods including the resistance type, CT type and the servo type. A contactless current sensor of servo type with a single power supply will be described below.

A contactless sensor driven by a single power supply is disclosed in JU-A-4-24070. This current sensor performs the sensing operation with a single power supply.

The provision of a single power supply, however, limits the measurement range to the capacity of the particular single power supply. In other words, the size of the measurement range of the contactless current sensor driven by a single power supply described in JU-A-4-24070 is equivalent to the voltage Vcc of the single power supply.

The specific measurement range can be set between 0 and +Vcc, between −Vcc/2 and +Vcc/2 or between −Vcc and 0 as desired to meet the requirement of each case of power generation or charging operation by effective use of a variable resistor. Even when a variable resistor is used, however, it is not an easy matter to change the reference voltage manually in accordance with the timing of the positive or negative direction of current.

Especially in the case where it is required to detect the charging such as when a regeneration current is generated, the problem is posed that the measurement range cannot be changed unless the resistance value is switched each time.

SUMMARY OF THE INVENTION

The object of the present invention, which has been developed in view of the above-mentioned situation, is to provide a contactless sensor driven by a single power supply, which can secure the same size of the measurement range as the double power supplies by enlarging the reference voltage in accordance with the charge or discharge mode even when a single power supply is used for drive.

In order to achieve this object, according to the present invention, there is provided a contactless sensor driven by a single power supply, comprising: a main power supply; a single auxiliary power supply; a coil wound with a secondary winding; an output resistor with one terminal thereof connected to the secondary winding for permitting a current to flow therein in the direction of magnetic fluxes generated in the coil in accordance with the discharge or charge operation of the main power supply; a series circuit including a plurality of resistors connected in series and supplied with a voltage from the auxiliary power supply; a voltage follower with the input terminal thereof connected to the voltage-dividing point of the series circuit and with the output terminal thereof connected to the other terminal of the output resistor; and a reference voltage control circuit connected to the voltage-dividing point for changing the input voltage of the voltage follower in accordance with the direction of the current flowing in the output resistor.

According to the invention, a current is supplied to the output resistor through the secondary winding in the direction determined by the direction of the magnetic fluxes generated in the coil in accordance with the charge or discharge mode of the main power supply. The input terminal of the voltage follower is connected to the voltage-dividing point of the series circuit on one hand and to the reference voltage control circuit on the other hand. The reference voltage control circuit is for changing the input voltage of the voltage follower in accordance with the direction of the current flowing in the output resistor. The overall measurement range, therefore, is enlarged as the measurement range is switched in accordance with the charge or discharge mode of the main power supply.

According to a preferred embodiment of the invention, the reference voltage changing means includes a transistor with the collector thereof connected to the voltage-dividing point through a resistor, which transistor is switched on and off in response to an external signal which in turn is switched in accordance with the direction of the current flowing in the output resistor.

According to another preferred embodiment of the invention, the reference voltage changing circuit includes a transistor with the collector terminal thereof connected to the voltage-dividing point through a resistor, and a comparator with two input terminals thereof connected to the ends of the output resistor respectively and an output terminal thereof connected to the base of the transistor.

In this embodiment, the voltage across the output resistor is directly monitored, and therefore the voltage at the voltage-dividing point can be changed with a greater rapidity than when controlled by an external signal.

According to still another preferred embodiment of the invention, the resistance value of the resistors of the series circuit and the resistance imposed on the collector terminal of the transistor are set to a predetermined value, whereby the input voltage of the voltage follower is switched between the earth voltage and the voltage of the auxiliary power supply in accordance with the direction of the current flowing in the output resistor.

This embodiment increases the overall size of the measurement range by a factor of two as compared with the voltage of the auxiliary voltage.

The nature, principle and utility of the invention will become more apparent from the following detailed description when read in conjunction with the accompanying drawings.

DESCRIPTION OF THE PREFERRED EMBODIMENTS

Embodiments of the present invention will be described below with reference to the accompanying drawings.

First embodiment

Figure 1:
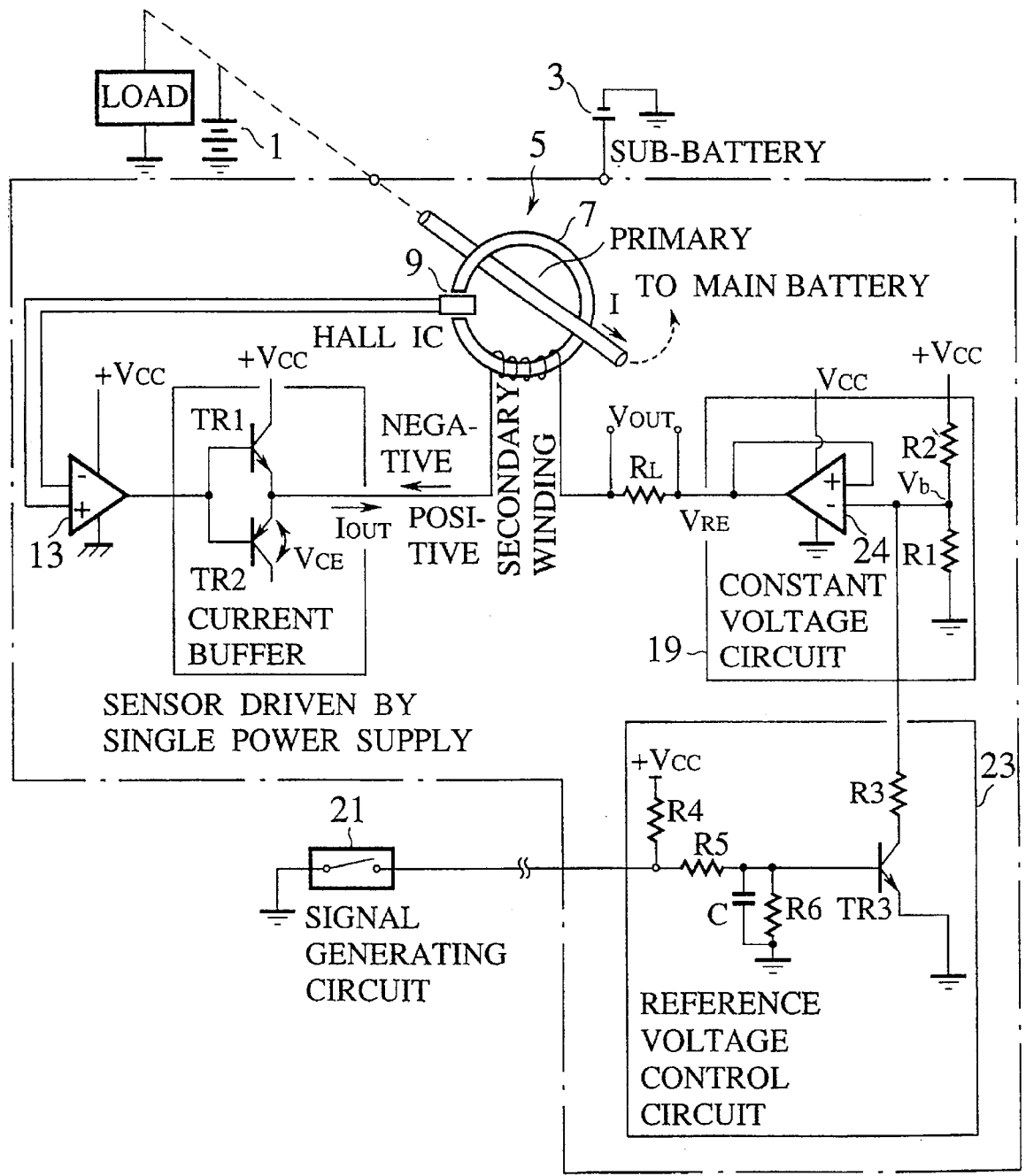
FIG. 1 is a diagram schematically showing the configuration of a contactless sensor driven by a single power supply according to a first embodiment of the invention.

FIG. 1 is a diagram schematically showing the configuration of a contactless sensor driven by a single power supply according to a first embodiment of the invention. As shown in FIG. 1, the current sensor constitutes a circuit driven by a single power supply, with each component circuit thereof operated only with the voltage Vcc of a sub-battery 3.

In FIG. 1, numeral 5 designates a coil. The coil 5 is configured of a wire from the main battery 1 passed through the magnetic core 7 thereof as the primary line and an output line from a current buffer described later as the secondary winding wound a predetermined number of turns on the magnetic core 7 thereof. Also, a Hall element 9 is arranged in the gap of the magnetic core 7.

The Hall element 9 generates at the output terminal thereof a voltage proportional to the magnetic flux density generated in the coil 5 and applies the voltage to a differential amplifier 13. The differential amplifier 13 is supplied with an output voltage of the Hall element 9, amplifies the voltage and applies the amplified voltage to a current buffer 15.

The current buffer 15 includes an NPN transistor TR1 and a PNP transistor TR2. The base terminal of each transistor is connected to the output terminal of the differential amplifier circuit 13, and the emitter terminal of each transistor is connected to a terminal of the secondary winding of the coil 5. In other words, the current buffer 15 constitutes a push-pull circuit.

Numeral 19 designates a constant-voltage circuit. In the constant-voltage circuit 19, a resistor R1 and a resistor R2 are connected in series with each other. One terminal of the series circuit is connected to Vcc and the other terminal of the series circuit is connected to the earth. The input terminal of a voltage follower 24 is connected to the junction point between the resistors R1 and R2, and the output terminal of the voltage follower 24 is connected to a terminal of the resistor $R_L$. The other terminal of the resistor $R_L$ is connected to the other terminal of the secondary winding of the coil 5.

Numeral 21 designates a signal generating circuit. The signal generating circuit 21, which is externally provided, is adapted to open the contacts thereof (turns off) upon receipt of a notice that the discharge operation ($I_{out}$ flowing in positive direction) is proceeding, and close the contacts thereof (turns on) upon receipt of a notice that the charge operation ($I_{out}$ flowing in negative direction) is proceeding.

Numeral 23 designates a reference voltage control circuit. The reference voltage control circuit 23 includes a resistor R4, a resistor R5, a resistor R6, a capacitor C, a resistor R6, a resistor R3 and a transistor TR3. One terminal of the resistor R4 is pulled up to Vcc, and the Other terminal thereof is connected to one terminal of the resistor R5. The other terminal of the resistor R4 and one terminal of the resistor R5 are connected to the external signal generating circuit 21.

The resistor R6 and the capacitor C are connected in parallel. One terminal of the parallel circuit is connected to the earth, and the other terminal thereof is connected to the other terminal of the resistor R5 and the base of the transistor TR3. One terminal of the resistor R3 is connected to the collector terminal of the transistor TR3, and the other terminal thereof is connected to the junction point between the resistor R1 and the resistor R2 of the constant voltage circuit 19.

Now, the operation is explained. Assume, for example, that the signal generating circuit 21 is in off state (in discharge mode with $I_{out}$ flowing in positive direction). The voltage Vcc is divided by the resistors R4, R5 and R6, and the resulting voltage $V_h$ is output to the transistor TR3. More specifically, a high-level voltage is output to the transistor TR3 and thereby turns on the transistor TR3.

As a consequence, the voltage $V_b$ at the voltage-dividing point and the reference voltage $V_{RE}$ constituting the output of the voltage follower 24 are given by equation (1) below.

$$V_b = V_{RE} = \left[ \left( \frac{R1R3}{R1+R3} \right) / \left\{ \left( \frac{R1R3}{R1+R3} \right) + R2 \right\} \right] \times Vcc \quad (1)$$

Assume that R1=1000K Ω, R2=10K Ω and R3=100Ω. Since R1>>R2>R3, this equation may be approximated as shown in equation (2).

$$V_b = V_{RE} = \{R3/(R2+R3)\} \times Vcc \quad (2)$$

Numerals are substituted into this equation, and Vcc is assumed to be 12 V. Then, $V_b = V_{RE} = 0.1188$. The reference voltage $V_{RE}$ is considered approximately zero, and therefore only a current in positive direction (in discharge mode) flows in the resistor $R_L$. In other words, only the current in positive direction can be detected.

Assuming that the signal generating circuit 21 turns on in charging mode, on the other hand, $V_h$ assumes the earth potential since the signal generating circuit 21 is connected to the earth, for example. The base of the transistor TR3 assumes a low level, so that the transistor TR3 turns off. In other words, the resistor R3 becomes open.

As a result, the voltage $V_b$ at the voltage-dividing point and the reference voltage $V_{RE}$ constituting the output of the voltage follower 24 are given by equation (3) below.

$$V_b = V_{RE} = \{R1/(R1+R2)\} \times Vcc \quad (3)$$

In the case where R1=1000K Ω and R2=10K Ω, the resistor R1 is large in value as compared with the resistor R2, and therefore this equation may be approximated as shown in equation (4).

$$Vb = V_{RE} = (R1/R1) \times Vcc \quad (4)$$

More specifically, the reference voltage $V_{RE}$ may be considered about Vcc, so that only a current in negative direction (in charge mode) flows in the resistor $R_L$. In other words, only a current in negative direction can be detected.

The capacitor C removes the noises due to the on-off operation of the signal-generating circuit 21, and the resistor R6 controls the discharge operation of the capacitor C.

More specifically, according to this embodiment, the reference voltage $V_{RE}$ is changed in value automatically by the pulse signal output in accordance with discharge or charge mode. When the voltage across the resistor $R_L$ is measured with each current flow in positive and negative directions as a cycle, for example, the value of 2×Vcc is obtained as a size of measurement range. In other words, a measurement range as wide as when driven by the two power supplies ±Vcc is obtained.

Second embodiment

The first embodiment, in which the reference voltage is changed by the external signal-generating circuit 21, somewhat poses a problem of detection response since an external signal is depended upon. According to the second embodiment under consideration, in contrast, a circuit having the following-described configuration is used instead of the signal-generating circuit 21.

Figure 2:
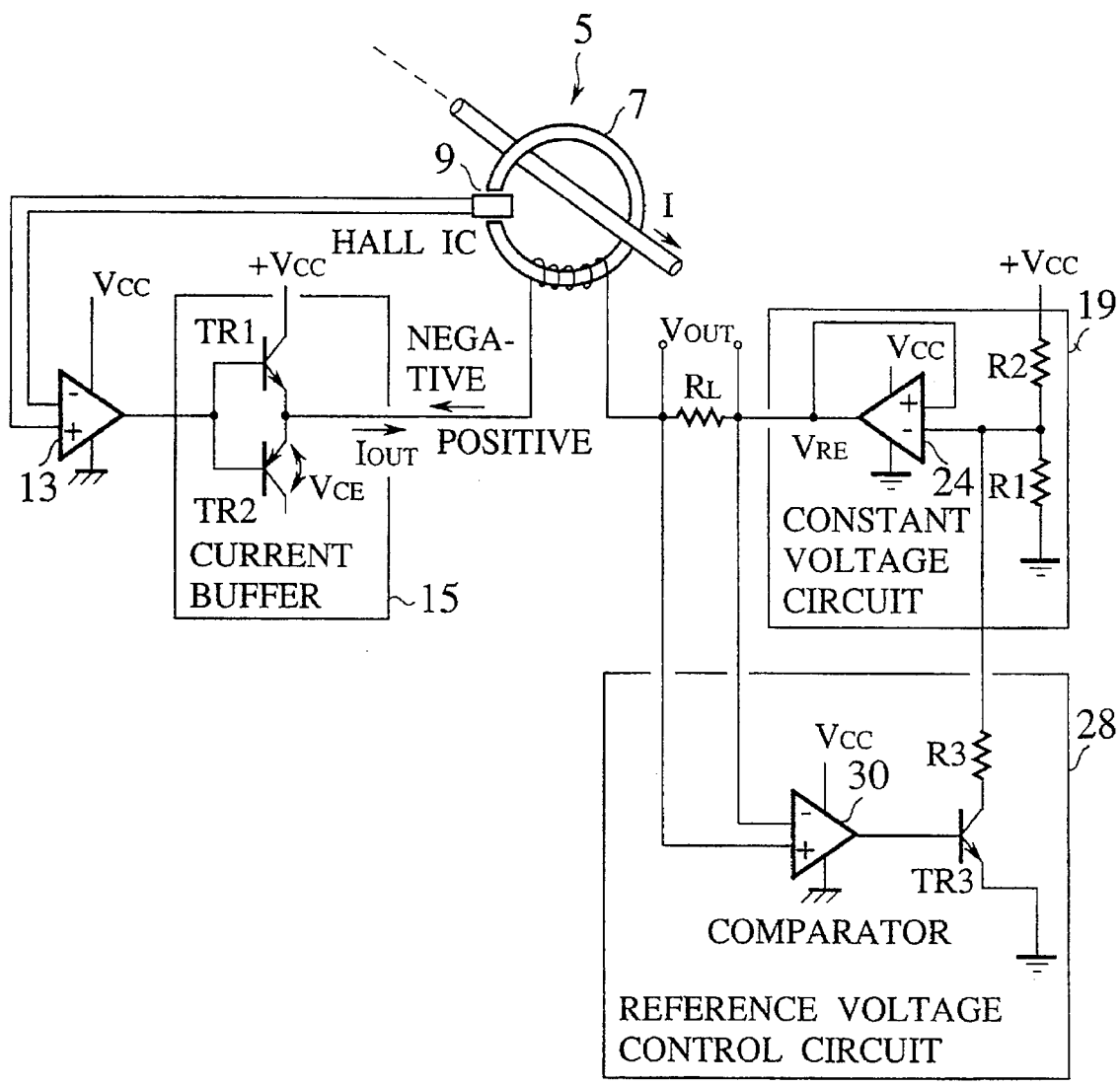
FIG. 2 is a diagram schematically showing the configuration a contactless sensor driven by a single power supply according to a second embodiment of the invention.

FIG. 2 is a diagram schematically showing the configuration of the second embodiment. In FIG. 2, the main battery 1 and the sub-battery are not included. Numerals 7 to 19 designate the same component parts as the corresponding component parts respectively in the first embodiment. Numeral 28 designates a reference voltage control circuit according to this embodiment. The reference voltage control circuit 28 includes a resistor R3, a transistor TR3 and a comparator 30. The input terminal of the comparator 30 is connected to the two terminals of the resistor $R_L$, and the output of the comparator 30 is connected to the base of the transistor TR3.

Now, the operation of this circuit will be explained. While in discharge mode ($I_{out}$ flowing in positive direction), a current flows in positive direction through the resistor $R_L$. In other words, a potential higher than $V_{RE}$ is generated on the secondary winding side of the resistor $R_L$. Consequently, the output of the comparator 30 rises to high level, and the transistor TR3 turns on. The voltage $V_b$ at the voltage dividing point and the reference voltage Van constituting the output of the voltage follower 24 are shown by equation (5).

$$V_b = V_{RE} = \left[ \left( \frac{R1R3}{R1+R3} \right) / \left\{ \left( \frac{R1R3}{R1+R3} \right) + R2 \right\} \right] \times V_{cc} \quad (5)$$

Assume that R1=1000K Ω R2=10K Ω and R3=100Ω. Since R1>>R2>R3, this equation may be approximated as shown in equation (6).

$$V_b = V_{RE} = \{R3/(R2+R3)\} \times V_{cc} \quad (6)$$

Numerals are substituted into this equation, and Vcc is assumed to be 12 V. Then, $V_b = V_{RE} = 0.1188$. Since the reference voltage $V_{RE}$ is considered about zero, only the current in positive direction (in discharge mode) flows in the resistor $R_L$. In other words, only the current flowing in positive direction can be detected.

When a current flows in negative direction in charge mode, the output of the comparator 30 assumes an low level, and the transistor TR3 turns off, with the resistor R3 becoming open.

As a result, the voltage $V_b$ at the voltage-dividing point and the reference voltage $V_{RE}$ constituting the output of the voltage follower 24 are given by equation (7) below.

$$V_b = V_{RE} = \{R1/(R1+R2)\} \times V_{cc} \quad (7)$$

In the case where R1=1000K Ω and R2=10K Ω, for example, the resistor R1 is large in value as compared with the resistor R2. Therefore, this equation may be approximated as equation (8).

$$V_b = V_{RE} = (R1/R1) \times V_{cc} \quad (8)$$

In other words, the reference voltage $V_{RE}$ can be considered about Vcc, so that only a current in negative direction (in charge mode) flows in the resistor $R_L$. That is to say, only a current flowing in negative direction can be detected.

More specifically, according to this embodiment, the direction of the current flow determined depending on discharge or charge mode is detected by the comparator 30, and the transistor TR3 is controlled thereby to change the reference voltage automatically. The voltage corresponding to the current flowing in positive or negative direction can thus be detected with great rapidity. At the same time, a measurement range as wide as when driven by two power supplied ±Vcc can be obtained.

Figure 3:
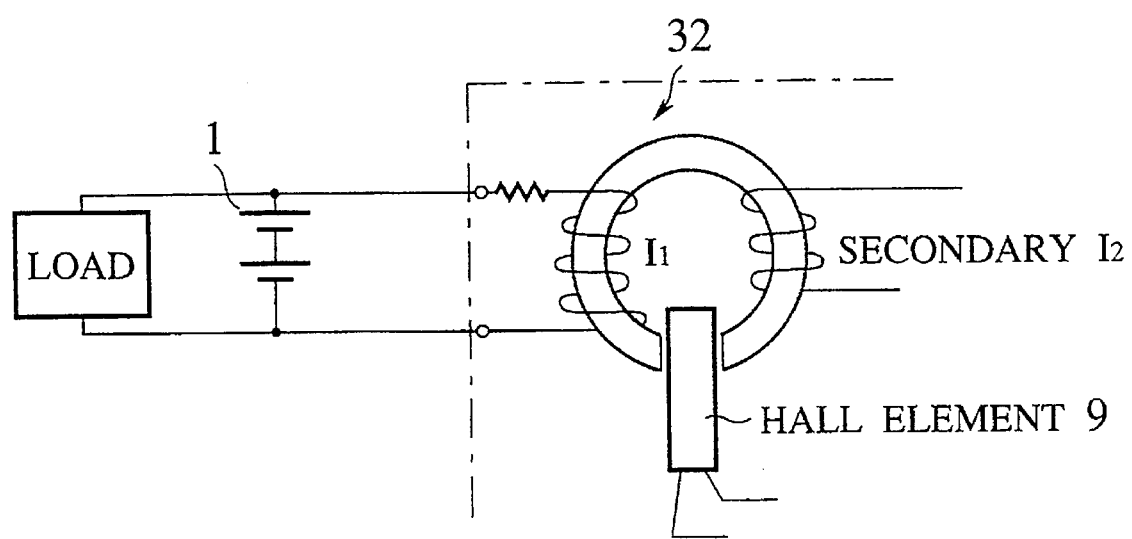
FIG. 3 is a diagram for explaining a type of voltage sensor.

Each of the above-mentioned embodiments, which were explained with reference to a sensor of current detection type, may alternatively use a voltage sensor driven by a single power supply and having a coil 32 constituted by the wire of the main battery 1 wound on the magnetic core thereof as the primary winding as shown in FIG. 3.

According to the embodiments of the invention, a current flows in the output resistor through the secondary winding in the direction corresponding to the direction of the magnetic fluxes generated in the coil in accordance with discharge or charge mode of the main power supply. The input terminal of the voltage follower, on the other hand, is connected to the voltage-dividing point of a series circuit on one hand and to a reference voltage control circuit on the other hand. The reference voltage control circuit changes the input voltage of the voltage follower in accordance with the direction of the current flowing in the output resistor. As a consequence, the measurement range is switched according to discharge or charge mode of the main power supply, thereby widening the overall measurement range.

Also, according to the second embodiment, the voltage across the output resistor is directly monitored by a comparator. The voltage at the voltage-dividing point, therefore, can be changed with greater rapidity than when controlled by an external signal.

Further, in the case where the resistance value of the resistors of the series circuit and the resistance value exerted on the collector terminal of the transistor are set to a predetermined value, so that the input voltage of the voltage follower can be switched between the earth voltage and the sub-battery voltage in accordance with the direction of the current flowing in the output resistor, the overall size of the measurement range can be increased to twice the sub-battery voltage.

It should be understood that many modifications and adaptations of the invention will become apparent to those skilled in the art and it is intended to encompass such obvious modifications and changes in the scope of the claims appended hereto.

What is claimed is:

1. A contactless sensor driven by a single power supply, comprising:

a main power supply;

a single auxiliary power supply;

a coil wound with a secondary winding;

an output resistor with one terminal thereof connected to the secondary winding for allowing a current to flow therein in the direction corresponding to the direction of the magnetic fluxes generated in the coil according to the discharge or charge mode of the main supply;

a series circuit including a plurality of resistors connected in series supplied with a voltage from the auxiliary power supply;

a voltage follower with the input terminal thereof connected to the voltage-dividing point of the series circuit and with the output terminal thereof connected to the other terminal of the output resistor; and a reference voltage control circuit connected to the voltage-dividing point for changing the input voltage of the voltage follower in accordance with the direction of the current flowing in the output resistor.

2. A contactless sensor driven by a single power supply according to claim 1, wherein said reference voltage control circuit includes a transistor with the collector thereof connected to the voltage-dividing point through a resistor, said transistor being switched in response to an external signal which in turn is switched in accordance with the direction of the current flowing in the output resistor.

3. A contactless sensor driven by a single power supply according to claim 1, wherein said reference voltage control circuit includes:

a transistor with the collector terminal thereof connected to the voltage-dividing point through a resistor; and a comparator with two input terminals thereof connected to the two terminals of the output resistor respectively and with the output terminal thereof connected to the base of the transistor.

4. A contactless sensor driven by a single power supply according to claim 2, wherein the resistance value of the resistors of the series circuit and the resistance value of the resistor imposed on the collector terminal of the transistor are set to a predetermined value, whereby the input voltage of the voltage follower is switched between the earth potential and the voltage of the auxiliary power supply in accordance with the direction of the current flowing in the output resistor.

5. A contactless sensor driven by a single power supply according to claim 3, wherein the resistance value of the resistors of the series circuit and the resistance value of the resistor imposed on the collector terminal of the transistor are set to a predetermined value, whereby the input voltage of the voltage follower is switched between the earth potential and the voltage of the auxiliary power supply in accordance with the direction of the current flowing in the output resistor.

* * * * *